United States Patent
Nagatomo et al.

(10) Patent No.: US 9,448,123 B2
(45) Date of Patent: Sep. 20, 2016

(54) TEMPERATURE SENSOR

(71) Applicant: MITSUBISHI MATERIALS CORPORATION, Tokyo (JP)

(72) Inventors: Noriaki Nagatomo, Naka (JP); Hitoshi Inaba, Naka (JP); Kazuta Takeshima, Naka (JP); Hiroshi Tanaka, Naka (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 0 days.

(21) Appl. No.: 14/763,477

(22) PCT Filed: Dec. 17, 2013

(86) PCT No.: PCT/JP2013/084768
§ 371 (c)(1),
(2) Date: Jul. 24, 2015

(87) PCT Pub. No.: WO2014/119206
PCT Pub. Date: Aug. 7, 2014

(65) Prior Publication Data
US 2015/0362381 A1  Dec. 17, 2015

(30) Foreign Application Priority Data
Jan. 31, 2013 (JP) ................................. 2013-016307

(51) Int. Cl.
*H01L 31/058* (2006.01)
*G01K 7/22* (2006.01)
(Continued)

(52) U.S. Cl.
CPC ............. *G01K 7/22* (2013.01); *G01K 1/143* (2013.01); *G01K 13/08* (2013.01); *H01C 1/142* (2013.01);
(Continued)

(58) Field of Classification Search
CPC ........... H01L 41/0825; H01L 41/1132; H01L 2224/75753; H01L 2224/7592; H01L 2224/77753; H01L 2224/7892; H01L 2224/7992; H01L 2224/80121; H01L 2224/81121; H01L 2224/82121; H01L 2224/83121
See application file for complete search history.

(56) References Cited

U.S. PATENT DOCUMENTS 4,702,619 A * 10/1987 Camp ..................... G01K 7/22
116/303

FOREIGN PATENT DOCUMENTS

| JP | 2008058226 A | 3/2008 |
|---|---|---|
| JP | 2012068116 A | 4/2012 |
| JP | 2012-182258 A | 9/2012 |

OTHER PUBLICATIONS

International Search Report of PCT/JP2013/084768 dated Mar. 25, 2014.

(Continued)

*Primary Examiner* — Thanh Y Tran
(74) *Attorney, Agent, or Firm* — Locke Lord LLP

(57) ABSTRACT

Provided is a temperature sensor that includes a pair of lead frames, a sensor portion connected to the pair of lead frames, and an insulating holding portion which is fixed to the pair of lead frames and holds the lead frames. The sensor portion includes an insulating film having a strip shape, a thin film thermistor portion pattern-formed at the center portion of the surface of the insulating film, a pair of comb electrodes which have a plurality of comb portions and are pattern-formed on at least one of the top or the bottom of the thin film thermistor portion with facing each other and a pair of pattern electrodes, of which one end is connected to the pair of comb electrodes and the other end is connected to the pair of lead frames at both ends of the insulating film, pattern-formed on the surface of the insulating film.

4 Claims, 14 Drawing Sheets

(51) Int. Cl.
  *G01K 13/08* (2006.01)
  *H01C 7/04* (2006.01)
  *G01K 1/14* (2006.01)
  *H01C 7/00* (2006.01)
  *H01L 23/495* (2006.01)
  *H01L 35/02* (2006.01)
  *H01C 1/142* (2006.01)

(52) U.S. Cl.
  CPC .............. *H01C 7/006* (2013.01); *H01C 7/008* (2013.01); *H01C 7/04* (2013.01); *H01L 23/495* (2013.01); *H01L 35/02* (2013.01); *H01L 2924/0002* (2013.01)

(56) References Cited

OTHER PUBLICATIONS

Microfilm of the specification and drawings annexed to the request of Japanese Utility Model Application No. 164935/1979 (Laid-open No. 82629/1981) (Ishizuka Electronics Corp.), Jul. 3, 1981.

* cited by examiner (a)

(b)

TEMPERATURE SENSOR

CROSS-REFERENCE TO RELATED APPLICATIONS

This application is the national phase under 35 U.S.C. §371 of PCT International Application No. PCT/JP2013/084,768, filed Dec. 17, 2013, which claims the benefit of Japanese Application No. 2013-016307, filed Jan. 31, 2013, the entire contents of the aforementioned applications are hereby incorporated herein by reference.

BACKGROUND OF THE INVENTION

1. Field of the Invention

The present invention relates to a temperature sensor which is preferably used for measuring the temperature of a heating roller in a copier, a printer, or the like.

2. Description of the Related Art

In general, a temperature sensor for measuring the temperature of a heating roller used in a copier or a printer is placed in contact with the heating roller. As such a temperature sensor, for example, Patent Documents 1 and 2 disclose a temperature sensor that has a pair of lead frames, a thermal sensing element which is disposed between and connected to these lead frames, a holding portion formed at the ends of the pair of lead frames, and a thin film sheet which is provided at one side of the lead frames and the thermal sensing element to be brought into contact with the heating roller.

Such a temperature sensor is brought into contact with the surface of the heating roller using the elastic force of the lead frames so as to detect the temperature of the heating roller.

In Patent Document 1, a bead type thermistor or a chip thermistor is employed as the thermal sensing element. In Patent Document 2, a thin film thermistor in which a thermal sensing film is formed on one surface of an insulating substrate such as alumina is employed as the thermal sensing element. The thin film thermistor consists of a thermal sensing film formed on one surface of an insulating substrate, a pair of lead portions for connecting the thermal sensing film to a pair of lead frames, and a protective film for covering the thermal sensing film.

Patent Document 3 discloses a temperature sensor in which a thermocouple is integrated with a contact plate consisting of a metal. The temperature sensor brings the contact plate into contact with a measurement object by obtaining a contact pressure due to the elasticity of the contact plate to perform temperature measurement.

PRIOR ART DOCUMENTS

Patent Documents

[Patent Document 1] Japanese Examined Patent Application Publication No. H6-29793
[Patent Document 2] Japanese Unexamined Patent Application Publication No. 2000-74752
[Patent Document 3] Japanese Unexamined Patent Application Publication No. H7-198504
[Patent Document 4] Japanese Unexamined Patent Application Publication No. 2004-319737

SUMMARY OF THE INVENTION

Problems to be Solved by the Invention

The following problems still remain in the conventional techniques described above.

Specifically, in the technique disclosed in Patent Document 1, a bead type thermistor or the like is used as the thermal sensing element. In this case, the thermal sensing element is spherical or ellipsoidal having a diameter of about 1 mm, and thus, is brought into point contact with the heating roller, resulting in a difficulty in accurate temperature detection. In addition, the thermal sensing element has a large volume, resulting in deterioration in responsiveness. Furthermore, point contact may lead to the formation of scratch marks on the surface of the roller in rotation.

In the technique disclosed in Patent Document 2, a thin film thermistor is used as the thermal sensing element, and thus, can be brought into surface contact with the heating roller. However, the thin film thermistor has a large volume when considering the insulating substrate and the lead portions constituting thereof, resulting in deterioration in responsiveness.

Furthermore, in the technique disclosed in Patent Document 3, a measurement object may be scratched by abutment with a metal contact plate, and responsiveness may be deteriorated due to the volume (such as thickness) of the thermocouple and the contact plate and the leak of heat from the metal contact plate.

The present invention has been made in view of the aforementioned circumstances, and an object of the present invention is to provide a temperature sensor that exhibits excellent responsiveness with high accuracy and provides less damage to a measurement object when pressed against a heating roller or the like to detect the temperature.

Means for Solving the Problems

The present invention adopts the following structure in order to solve the aforementioned problems. Specifically, a temperature sensor according to a first aspect of the present invention is characterized in that the temperature sensor includes a pair of lead frames, a sensor portion connected to the pair of lead frames, and an insulating holding portion which is fixed to the pair of lead frames and holds the lead frames, wherein the sensor portion includes an insulating film having a strip shape, a thin film thermistor portion pattern-formed with a thermistor material at the center portion of the surface of the insulating film, a pair of comb electrodes which have a plurality of comb portions and are pattern-formed on at least one of the top or the bottom of the thin film thermistor portion with facing each other, and a pair of pattern electrodes, of which one end is connected to the pair of comb electrodes and the other end is connected to the pair of lead frames at both ends of the insulating film, pattern-formed on the surface of the insulating film, and wherein the thin film thermistor portion is disposed on the distal end of the insulating film in a state of being bent into a substantially U-shape, and both ends of the insulating film are fixed to the pair of lead frames.

Since, in the temperature sensor, the thin film thermistor portion is disposed on the distal end of the insulating film in a state of being bent into a substantially U-shape and both ends of the insulating film are fixed to the pair of lead frames, the distal end of the bent insulating film is brought into abutment against the measurement object, which leads to the flexure of the entire insulating film, resulting in obtaining strong elasticity and rigidity. In addition, the temperature sensor can measure the temperature without damaging the measurement object due to the flexibility of the insulating film. The insulating film can flexibly match the shape of the measurement object due to its wide deformation range and can adjust the level of pressing. Furthermore, the insulating film exhibits less leak of heat as compared with the metal contact plate, resulting in obtaining high responsiveness due to a synergistic effect with a thin film thermistor portion of small volume. Specifically, the thickness of the entire temperature sensor may be thinned by the presence of the thin insulating film and the thin film thermistor portion directly formed on the insulating film, so that the temperature sensor may exhibit excellent responsiveness by a small volume thereof.

Since the pair of lead frames is connected to the pair of pattern electrodes, the thin film thermistor portion and the lead frames are connected to each other via the pattern electrodes directly formed on the insulating film, so that the influence of thermal conductivity with the lead frames is suppressed by a pattern-formed thin wiring as compared with the case where the thin film thermistor portion and the lead frames are connected to each other via lead wires or the like. Since the temperature sensor has high flatness in the contact area against a measurement object and thus is brought into surface contact therewith, accurate temperature detection may be achieved and the surface of the measurement object such as a heating roller or the like in rotation is less prone to be damaged.

A temperature sensor according to a second aspect of the present invention is characterized in that the insulating film is bent to protrude in the protruding direction of the lead frames according to the first aspect of the present invention.

Specifically, since, in the temperature sensor, the insulating film is bent to protrude in the protruding direction of the lead frames, the measurement object is placed forward in the protruding direction of the lead frames and the distal end of the bent sensor portion is brought into abutment against the measurement object, resulting in capable of measuring the temperature thereof.

A temperature sensor according to a third aspect of the present invention is characterized in that the insulating film is bent to protrude in a direction perpendicular to the protruding direction of the lead frames according to the first aspect of the present invention.

Specifically, since, in the temperature sensor, the insulating film is bent to protrude in a direction perpendicular to the protruding direction of the lead frames, the measurement object is placed forward in a direction perpendicular to the protruding direction of the lead frames and the distal end of the bent sensor portion is brought into abutment against the measurement object, resulting in capable of measuring the temperature thereof.

A temperature sensor according to a fourth aspect of the present invention is characterized in that the thin film thermistor portion consists of a metal nitride represented by the general formula: $Ti_xAl_yN_z$ (where $0.70 \leq y/(x+y) \leq 0.95$, $0.4 \leq z \leq 0.5$, and $x+y+z=1$), and the crystal structure thereof is a hexagonal wurtzite-type single phase according to any one of the first to third aspects of the present invention.

In general, there has been a requirement for a thermistor material used for a temperature sensor or the like to exhibit a high B constant so as to obtain a high precision and high sensitivity temperature sensor.

Conventionally, oxides of a transition metal such as Mn, Co, Fe, and the like are typically used as such thermistor materials. These thermistor materials need to be fired at a temperature of 600° C. or greater in order to obtain a stable thermistor characteristic.

In addition to thermistor materials consisting of metal oxides as described above, Patent Document 3 discloses a thermistor material consisting of a nitride represented by the general formula: $M_xA_yN_z$ (where M represents at least one of Ta, Nb, Cr, Ti, and Zr, A represents at least one of Al, Si, and B, $0.1 \leq x \leq 0.8$, $0 < y \leq 0.6$, $0.1 \leq z \leq 0.8$, and $x+y+z=1$). In Patent Document 3, only a Ta—Al—N-based material having a range of $0.5 \leq x \leq 0.8$, $0.1 \leq y \leq 0.5$, $0.2 \leq z \leq 0.7$, and $x+y+z=1$ is described in Examples. The Ta—Al—N-based material is produced by sputtering in a nitrogen gas-containing atmosphere using a material containing the elements as set forth as a target. The obtained thin film is subject to a heat treatment at a temperature from 350 to 600° C. as required.

In recent years, the development of a film-type thermistor sensor made of a thermistor material on a resin film has been considered, and thus, it has been desired to develop a thermistor material which can be directly deposited on a film. Specifically, it is expected to obtain a flexible thermistor sensor by using a film. Furthermore, although it is desired to develop a very thin thermistor sensor having a thickness of about 0.1 mm, a substrate material using a ceramics material such as alumina has often conventionally used. For example, if the substrate material is thinned to a thickness of 0.1 mm, the substrate material is very fragile and easily breakable. Thus, it is expected to obtain a very thin thermistor sensor by using a film.

Conventionally, in a temperature sensor formed by a nitride-based thermistor consisting of TiAlN, when a nitride-based thermistor is formed by laminating a thermistor material layer consisting of TiAlN and electrodes on the surface of a film, an electrode layer such as Au is deposited on the thermistor material layer, and the electrode layer is patterned into a comb shape having multiple comb portions. However, if the thermistor material layer is gently bent with a large radius of curvature, cracks are not easily generated in the thermistor material layer, resulting in no change in electric properties such as a resistance value, whereas if the thermistor material layer is severely bent with a small radius of curvature, cracks are easily generated in the thermistor material layer, resulting in a decrease in reliability of electric properties due to a large change in resistance value or the like. In particular, if the film is severely bent with a small radius of curvature in a direction perpendicular to the extending direction of the comb portions, cracks are easily generated near the edge of electrodes due to a difference in stress between the comb electrodes and the thermistor material layer as compared with the case where the film is bent in the extending direction of the comb portions, resulting in an undesirable decrease in reliability of electric properties.

In addition, a film made of a resin material typically has a low heat resistance temperature of 150° C. or lower, and even polyimide which is known as a material relatively having a high heat resistance temperature only has a heat resistance temperature of about 300° C. Hence, when a heat treatment is performed in steps of forming a thermistor material, it has been conventionally difficult to use such a film. The above conventional oxide thermistor material needs to be fired at a temperature of 600° C. or higher in order to realize a desired thermistor characteristic, so that a film-type thermistor sensor which is directly deposited on a film cannot be realized. Thus, it has been desired to develop a thermistor material which can be directly deposited on a film without fixing. However, even in the thermistor material disclosed in Patent Document 4, there has remained the need to perform a heat treatment for the obtained thin film at a temperature from 350 to 600° C. as required in order to obtain a desired thermistor characteristic. As the thermistor material, although a material having a B constant of about 500 to 3000 K was obtained in Examples of a Ta—Al—N- based material, there is no description regarding heat resistance, and thus, the thermal reliability of a nitride-based material has been unknown.

The present inventors' serious endeavor by focusing on an AlN-based material among nitride materials found that, although it is difficult for AlN which is an insulator to obtain an optimum thermistor characteristic (B constant: about 1000 to 6000 K), the AlN-based material having a good B constant and exhibiting excellent heat resistance may be obtained without firing by substituting an Al-site with a specific metal element for improving electric conductivity and by forming it into a specific crystal structure.

Thus, the present invention has been obtained on the basis of the above finding. Since the thin film thermistor portion consists of a metal nitride represented by the general formula: $Ti_xAl_yN_z$ (where $0.70 \leq y/(x+y) \leq 0.95$, $0.4 \leq z \leq 0.5$, and $x+y+z=1$), wherein the crystal structure thereof is a hexagonal wurtzite-type single phase, the metal nitride material having a good B constant and exhibiting excellent heat resistance may be obtained without firing.

Note that, when the value "$y/(x+y)$" (i.e., $Al/(Ti+Al)$) is less than 0.70, a wurtzite-type single phase is not obtained but two coexist phases of a wurtzite-type phase and a NaCl-type phase or a single phase of only a NaCl-type phase may be obtained, so that a sufficiently high resistance and a high B constant cannot be obtained.

If the ratio of "$y/(x+y)$" (i.e., $Ai/(Ti+Al)$) exceeds 0.95, the metal nitride material exhibits very high resistivity and extremely high electrical insulation, so that the metal nitride material is not applicable as a thermistor material.

If the ratio of "z" (i.e., $N/(Ti+Al+N)$) is less than 0.4, the amount of nitrogen contained in the metal is small, so that a wurtzite-type single phase cannot be obtained. Consequently, a sufficiently high resistance and a high B constant cannot be obtained.

Furthermore, if the ratio of "z" (i.e., $N/(Ti+Al+N)$) exceeds 0.5, a wurtzite-type single phase cannot be obtained. This is because a stoichiometric ratio of $N/(Ti+Al+N)$ in a wurtzite-type single phase when there is no defect at nitrogen-site is 0.5.

Effects of the Invention

According to the present invention, the following effects may be provided.

Specifically, according to the temperature sensor of the present invention, since the thin film thermistor portion is disposed on the distal end of the insulating film in a state of being bent into a substantially U-shape and both ends of the insulating film are fixed to the pair of lead frames, strong elasticity and rigidity are obtained, so that the temperature sensor can measure the temperature without damaging the measurement object, resulting in obtaining high responsiveness.

Furthermore, the thin film thermistor portion consists of a metal nitride represented by the general formula: $Ti_xAl_yN_z$ (where $0.70 \leq y/(x+y) \leq 0.95$, $0.4 \leq z \leq 0.5$, and $x+y+z=1$), and the crystal structure thereof is a hexagonal wurtzite-type single phase, the metal nitride material having a good B constant and exhibiting excellent heat resistance may be obtained without firing.

Thus, the temperature sensor of the present invention is capable of a stable surface contact by the presence of the sensor portion with strong elasticity and flexibility and can perform accurate temperature measurement with high responsiveness, and thus, is preferably used for measuring the temperature of a heating roller in a copier, a printer, or the like.

BEST MODES FOR CARRYING OUT THE INVENTION

Hereinafter, a description will be given of a temperature sensor according to a first embodiment of the present invention with reference to FIGS. 1 to 7. In a part of the drawings used in the following description, the scale of each component is changed as appropriate so that each component is recognizable or is readily recognized.

Figure 1:
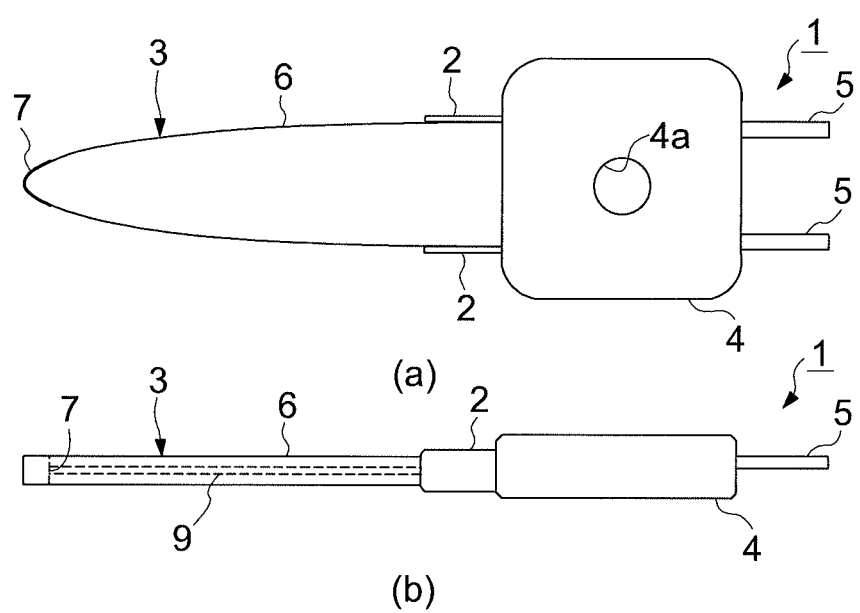
FIG. 1 is a plan view and a front view illustrating a temperature sensor according to a first embodiment of the present invention.

As shown in FIG. 1, a temperature sensor (1) of the present embodiment includes a pair of lead frames (2), a sensor portion (3) connected to the pair of lead frames (2), and an insulating holding portion (4) which is fixed to the pair of lead frames (2) and holds the lead frames (2).

The pair of lead frames (2) is formed of an alloy such as a copper based alloy, an iron based alloy, stainless, or the like, and is supported by the holding portion (4) made of resin while the interval between the lead frames (2) is kept constant. Note that the pair of lead frames (2) is connected to a pair of lead wires (5) in the holding portion (4). The holding portion (4) has a mounting hole (4a).

Figure 3:
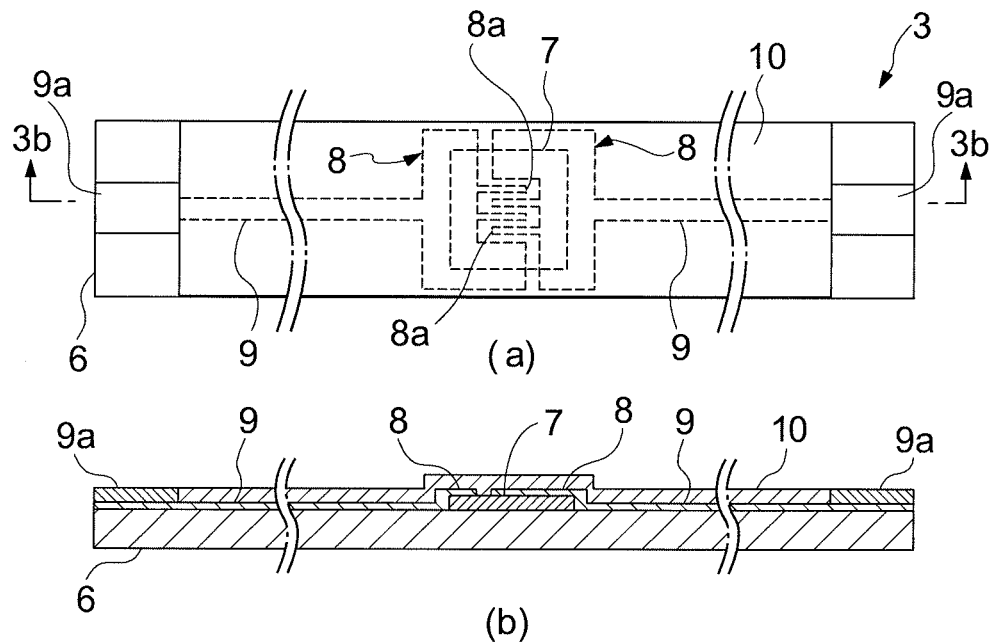
FIG. 3 is a plan view and a cross-sectional view, taken along the line 3b-3b, illustrating a sensor portion according to the first embodiment.

As shown in FIG. 3, the sensor portion (3) includes an insulating film (6) having a strip shape, a thin film thermistor portion (7) pattern-formed with a thermistor material on the center portion of the surface of the insulating film, a pair of comb electrodes (8) which have a plurality of comb portions (8a) and are pattern-formed on the top of the thin film thermistor portion (7) with facing each other, and a pair of pattern electrodes (9), of which one end is connected to the pair of comb electrodes (8) and the other end is connected to the pair of lead frames (2) at both ends of the insulating film (6), pattern-formed on the surface of the insulating film (6).

The thin film thermistor portion (7) is disposed on the distal end of the insulating film (6) in a state of being bent into a substantially U-shape, and both ends of the insulating film (6) are fixed to the pair of lead frames (2).

The temperature sensor (1) of the present embodiment includes a protective film (10) that is formed on the insulating film (6) and covers the thin film thermistor portion (7), the comb electrodes (8), and the pattern electrodes (9) excluding both ends of the insulating film (6) at which proximal ends (adhesive pad portions (9a)) of the pattern electrodes (9) are disposed.

While, in the present embodiment, the comb electrodes (8) are formed on the thin film thermistor portion (7), the comb electrodes may also be formed under the thin film thermistor portion (7).

The pair of pattern electrodes (9) extends from the comb portions (Sa) on the thin film thermistor portion (7) disposed at the center portion of the insulating film (6) to the vicinity of both ends of the insulating film (6). Note that the adhesive pad portions (9a) are formed on the pattern electrodes (9) in the vicinity of both ends of the insulating film (6).

Furthermore, the distal ends of the pair of lead frames (2) are connected to the pattern electrodes (9) at both ends of the insulating film (6). Specifically, the distal ends of the lead frames (2) is bonded to the adhesive pad portions (9a) of the pattern electrodes (9) formed on the insulating film (6) by soldering or with a conductive resin adhesive or the like.

As described above, the thin film thermistor portion (7) is disposed on the distal end of the insulating film (6) in a state of being bent into a substantially U-shape, and both ends of the insulating film (6) are fixed to the pair of lead frames (2). In the present embodiment, the insulating film (6) is bent to protrude in the protruding direction of the lead frames (2). Specifically, the sensor portion (3) is attached to be spanned between the distal ends of the pair of lead frames (2) in a state where the sensor portion (3) is bent about the thin film thermistor portion (7) so as to extend in the protruding direction of the lead frames (2). The insulating film (6) is disposed on the inner surface of the lead frames (2) and the adhesive pad portions (9a) are bonded to the inner surface of the lead frames (2).

The insulating film (6) is, for example, a polyimide resin sheet formed in a strip having a thickness from 50 to 125 µm. If the insulating film (6) has a thickness thinner than this range, sufficient rigidity is hardly achievable even when the insulating film (6) is bent into a substantially U shape, whereas if the insulating film (6) has a thickness thicker than this range, responsiveness may be deteriorated. Although the insulating film (6) may also be produced by polyethylene terephthalate (PET), polyethylene naphthalate (PEN), or the like, a polyimide film is preferably used for measuring the temperature of a heating roller because the maximum temperature that can be used thereof is as high as 180° C.

The thin film thermistor portion (7) is arranged at the center portion of the insulating film (6) and is formed of a thermistor material of TiAlN. In particular, the thin film thermistor portion (7) consists of a metal nitride represented by the general formula: $Ti_xAl_yN_z$ (where $0.70 \leq y/(x+y) \leq 0.95$, $0.4 \leq z \leq 0.5$, and $x+y+z=1$), and the crystal structure thereof is a hexagonal wurtzite-type single phase.

Each of the pattern electrodes (9) and the comb electrodes (8) has a bonding layer of Cr or NiCr having a film thickness from 5 to 100 nm formed on the thin film thermistor portion (7) and an electrode layer of a noble metal such as Au having a film thickness from 50 to 1000 nm formed on the bonding layer.

The pair of the comb electrodes (8) is a comb-shaped pattern which the comb electrodes (8) are arranged in facing each other and the comb portions (Sa) alternate.

Note that the comb portions (8a) extend along the extending direction of the insulating film (6). Specifically, temperature measurement is performed with the thin film thermistor portion (7) serving as the distal end being brought into abutment with the heating roller in rotation. Since the insulating film (G) is bent into an U shape so as to form a curvature along its extending direction, the bending stress is also applied to the thin film thermistor portion (7) in the same direction as the insulating film (6). At this time, the comb portions (Sa) extend in the same direction as the insulating film (6), which reinforces the thin film thermistor portion (7), resulting in suppression of occurrence of cracks.

The protective film (10) is an insulating resin film or the like, and a polyimide film having a thickness of 20 µm is employed as the protective film (10). The protective film (10) is printed onto the insulating film (6) excluding the adhesive pad portions (9a). Note that the polyimide coverlay film may also be bonded to the insulating film (6) with an adhesive so as to form the protective film (10).

Figure 2:
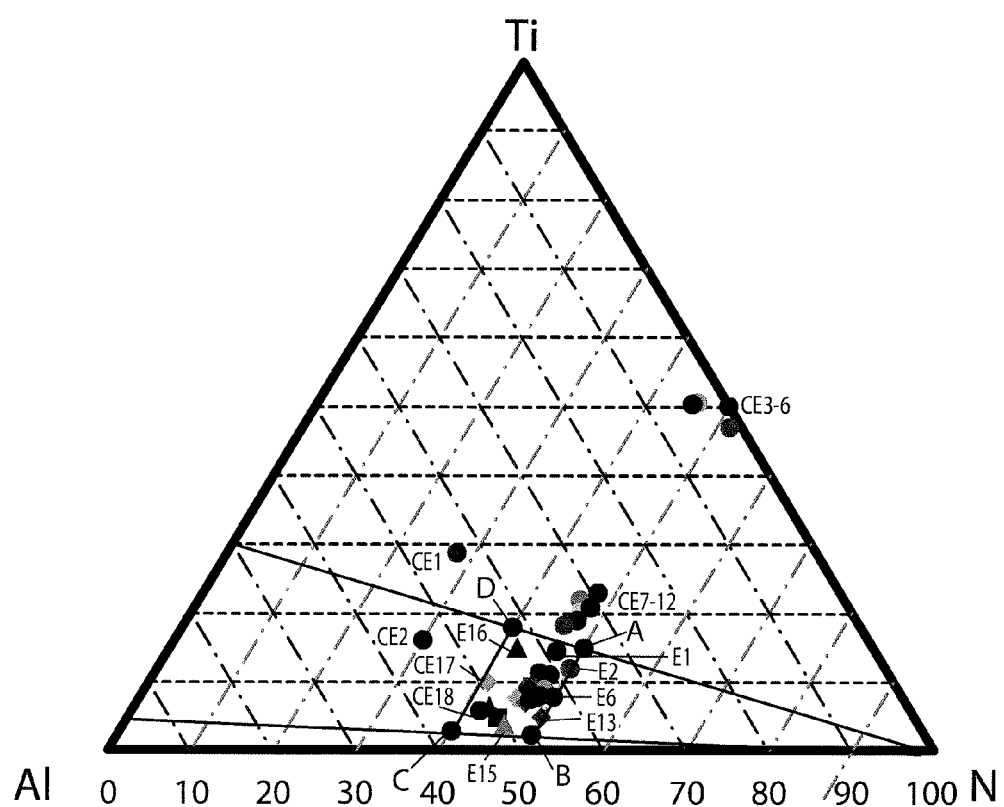
FIG. 2 is a Ti—Al—N-based ternary phase diagram illustrating the composition range of a metal nitride material for a thermistor according to the first embodiment.

As described above, the thin film thermistor portion (7) is a metal nitride material consisting of a metal nitride represented by the general formula: $Ti_xAl_yN_z$ (where $0.70 \leq y/(x+y) \leq 0.95$, $0.4 \leq z \leq 0.5$, and $x+y+z=1$), wherein the crystal structure thereof is a wurtzite-type (space group $P6_3mc$ (No. 186)) single phase having a hexagonal crystal system. Specifically, the metal nitride material has a composition within the region enclosed by the points A, B, C, and D in the Ti—Al—N-based ternary phase diagram as shown in FIG. 2, wherein the crystal phase thereof is a wurtzite-type metal nitride.

Note that the composition ratios (x, y, z, (at %)) at the points A, B, C, and D are A (15, 35, 50), B (2.5, 47.5, 50), C (3, 57, 40), and D (18, 42, 40), respectively.

Also, the thin film thermistor portion (7) is formed into the shape of a film having a film thickness from 100 to 1000 nm and is a columnar crystal extending in a vertical direction to the surface of the film. Furthermore, it is preferable that the thin film thermistor portion (7) is strongly oriented along the c-axis more than the a-axis in a vertical direction to the surface of the film.

Note that the decision on whether the thin film thermistor portion (7) has a strong a-axis orientation (100) or a strong c-axis orientation (002) in a vertical direction (film thickness direction) to the surface of the film is made by examining the orientation of the crystal axis using X-ray diffraction (XRD). When the peak intensity ratio of "the peak intensity of (100)"/"the peak intensity of (002)" is less than 1, where (100) is the Miller index indicating a-axis orientation and (002) is the Miller index indicating c-axis orientation, the thin film thermistor portion (7) is determined to have a strong c-axis orientation.

A description will be given below of a method for producing the temperature sensor (1) with reference to FIGS. 1 and 3 to 6.

The method for producing the temperature sensor (1) of the present embodiment includes a thin film thermistor portion forming step of patterning a thin film thermistor portion (7) on an insulating film (6); an electrode forming step of patterning a pair of pattern electrodes (9) on the insulating film (6) with a pair of comb electrodes (8) facing each other being disposed on the thin film thermistor portion (7); a protective film forming step of forming a protective film (10) on the surface of the insulating film (6); and a lead frame attaching step of attaching the lead frames (2) to the sensor portion (3).

As a more specific example of such a production method, a thermistor film of $Ti_xAl_yN_z$ (x=9, y=, 43, z=48) having a film thickness of 200 nm is deposited on the insulating film (6) made of a polyimide film having a thickness of 50 μm using a Ti—Al alloy sputtering target in the reactive sputtering method in a nitrogen-containing atmosphere. The thermistor film is produced under the sputtering conditions of an ultimate degree of vacuum of $5\times10^{-6}$ Pa, a sputtering gas pressure of 0.4 Pa, a target input power (output) of 200 W, and a nitrogen gas fraction under a mixed gas (Ar gas+nitrogen gas) atmosphere of 20%.

Figure 4:
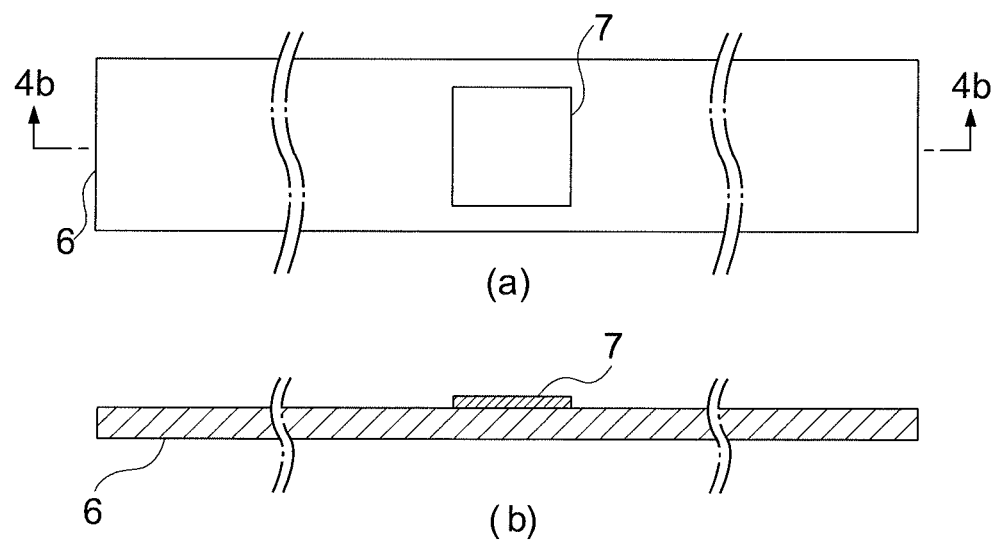
FIG. 4 is a plan view and a cross-sectional view, taken along the line 4b-4b, illustrating a thin film thermistor portion forming step according to the first embodiment.

A resist solution is coated on the formed thermistor film using a bar coater, and then prebaking is performed for 1.5 minutes at a temperature of 110° C. After being exposed by an exposure device, an unnecessary portion is removed by a developing solution, and then patterning is performed by post baking for 5 minutes at a temperature of 150° C. Then, an unnecessary thermistor film of $Ti_xAl_yN_z$ is subject to wet etching using commercially available Ti etchant, and then the resist is stripped so as to form the thin film thermistor portion (7) in a desired shape as shown in FIG. 4.

Next, a Cr film bonding layer having a film thickness of 20 nm is formed on the thin film thermistor portion (7) and the insulating film (6) by the sputtering method. Furthermore, an Au film electrode layer having a film thickness of 100 nm is formed on the bonding layer by the sputtering method.

Figure 5:
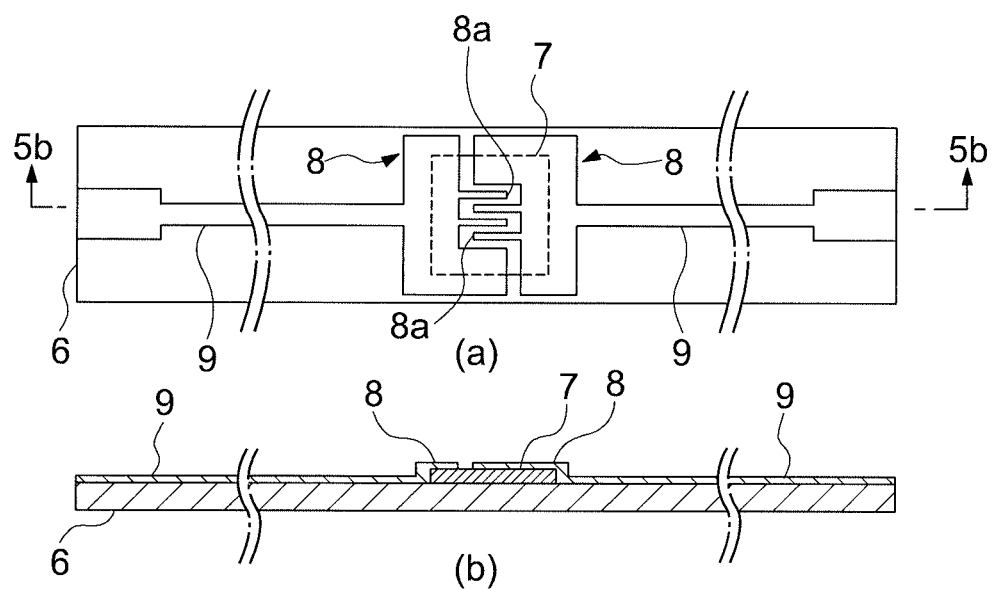
FIG. 5 is a plan view and a cross-sectional view, taken along the line 5b-5b, illustrating an electrode forming step according to the first embodiment.

Next, a resist solution is coated on the formed electrode layer using a bar coater, and then prebaking is performed for 1.5 minutes at a temperature of 110° C. After being exposed by an exposure device, an unnecessary portion is removed by a developing solution, and then patterning is performed by post baking for 5 minutes at a temperature of 150° C. Then, an unnecessary electrode portion is subject to wet etching sequentially using commercially available Au etchant and Cr etchant, and then the resist is stripped so as to form desired comb electrodes (8) and pattern electrodes (9) as shown in FIG. 5.

Figure 6:
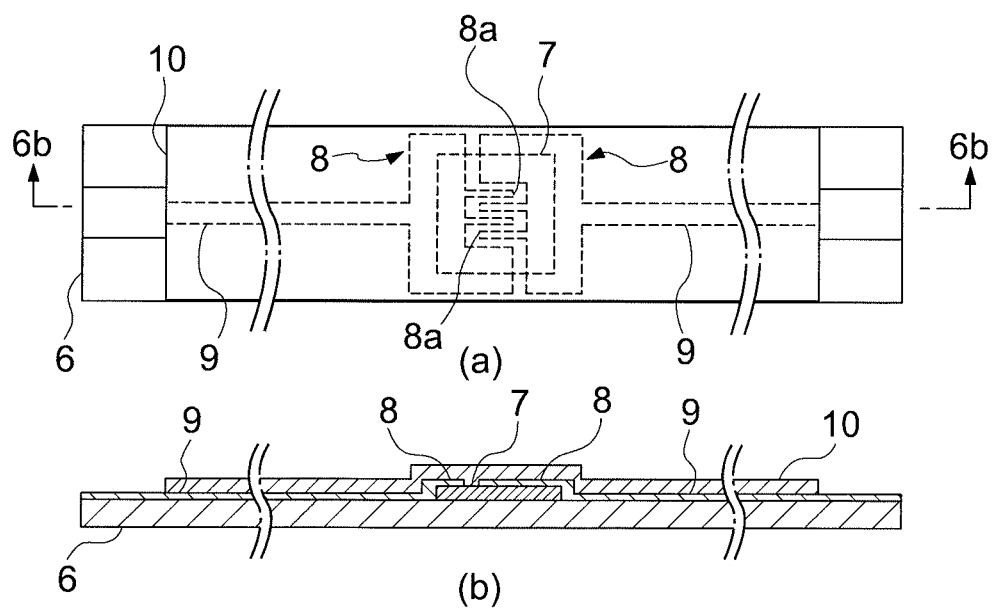
FIG. 6 is a plan view and a cross-sectional view, taken along the line 6b-6b, illustrating a protective film forming step according to the first embodiment.

Furthermore, a polyimide varnish is coated on the resulting comb electrodes (8) by the printing method and pattern electrodes (9) and then is cured for 30 minutes at a temperature of 250° C. to thereby form a polyimide protective film (10) having a thickness of 20 μm as shown in FIG. 6. The sensor portion (3) is thus produced.

Next, the distal ends of the pair of lead frames (2) are disposed on the adhesive pad portions (9a) of the pattern electrodes (9) with the sensor portion (3) folded. As shown in FIG. 1, the inner surface of the distal ends of the lead frames (2) is bonded to the adhesive pad portions (9a) with a conductive resin adhesive. The temperature sensor (1) is thus produced.

When a plurality of sensor portions (3) is simultaneously produced, the thin film thermistor portion (7), the comb electrodes (8), the pattern electrodes (9), and the protective film (10) are formed in plural on a large sized sheet of the insulating film (6) as described above, and then the resulting laminated large sheet is cut into a plurality of sensor portions (3).

Since, in the temperature sensor (1) of the present embodiment, the thin film thermistor portion (7) is disposed on the distal end of the insulating film (6) in a state of being bent into a substantially U-shape, and both ends of the insulating film (6) are fixed to the pair of lead frames (2), the distal end of the bent insulating film (6) is brought into abutment against the measurement object, which leads to the flexure of the entire insulating film (6), resulting in obtaining strong elasticity and rigidity. In addition, the temperature sensor (1) can measure the temperature without damaging the measurement object due to the flexibility of the insulating film (6). The insulating film (6) can flexibly match the shape of the measurement object due to its wide deformation range and can adjust the level of pressing. Furthermore, the insulating film (6) exhibits less leak of heat as compared with the metal contact plate, resulting in obtaining high responsiveness due to a synergistic effect with the thin film thermistor portion (7) of small volume. Specifically, the thickness of the entire temperature sensor (1) may be thinned by the presence of the thin insulating film (6) and the thin film thermistor portion (7) directly formed on the insulating film (6), so that the temperature sensor (1) may exhibit excellent responsiveness in a small volume thereof.

Since the pair of lead frames (2) is connected to the pair of pattern electrodes (9), the thin film thermistor portion (7) and the lead frames (2) are connected to each other via the pattern electrodes (9) directly formed on the insulating film (6), so that the influence of thermal conductivity with the lead frames (2) is suppressed by a patterned thin wiring as compared with the case where the thin film thermistor portion (7) and the lead frames (2) are connected to each other via lead wires or the like. Since the temperature sensor (1) has high flatness over the contact area against a measurement object and thus is brought into surface contact therewith, accurate temperature detection may be achieved and the surface of the measurement object such as a heating roller or the like in rotation is less prone to be damaged.

Since the insulating film (6) is bent to protrude in the protruding direction of the lead frames (2), the measurement object is placed forward in the protruding direction of the lead frames (2) and the distal end of the bent sensor portion (3) is brought into abutment against the measurement object, resulting in capable of measuring the temperature thereof.

Since the thin film thermistor portion (7) consists of a metal nitride represented by the general formula: $Ti_xAl_yN_z$ (where $0.70 \leq y/(x+y) \leq 0.95$, $0.4 \leq z \leq 0.5$, and $x+y+z=1$), wherein the crystal structure thereof is a wurtzite-type single phase having a hexagonal crystal system, the metal nitride material having a good B constant and exhibiting excellent heat resistance may be obtained without firing.

Since the metal nitride material is a columnar crystal extending in a vertical direction to the surface of the film, the crystallinity of the film is high, resulting in obtaining high heat resistance.

Furthermore, since the metal nitride material is strongly oriented along the c-axis more than the a-axis in a vertical direction to the surface of the film, the metal nitride material having a high B constant as compared with the case of a strong a-axis orientation is obtained.

Since, in the method for producing the thermistor material layer (the thin film thermistor portion (7)) of the present embodiment, film deposition is performed by reactive sputtering in a nitrogen-containing atmosphere using a Ti—Al alloy sputtering target, so that the metal nitride material consisting of the above TiAlN can be deposited on a film without firing.

Since a sputtering gas pressure during the reactive sputtering is set to be less than 0.67 Pa, the film made of the metal nitride material, which is strongly oriented along the c-axis more than the a-axis in a vertical direction to the surface of the film, can be formed.

Thus, since, in the temperature sensor (1) of the present embodiment, the thin film thermistor portion (7) is formed of the thermistor material layer on the insulating film (6), the insulating film (G) having low heat resistance, such as a resin film, can be used by the presence of the thin film thermistor portion (7) which is formed without firing and has a high B constant and high heat resistance, so that a thin and flexible thermistor sensor having an excellent thermistor characteristic is obtained.

Conventionally, a substrate material using a ceramics material such as alumina has often been used. For example, if the substrate material is thinned to a thickness of 0.1 mm, the substrate material is very fragile and easily breakable. In the present invention, a film can be used, so that a very thin film-type thermistor sensor (the sensor portion (3)) having a thickness of 0.1 mm can be obtained.

Figure 7:
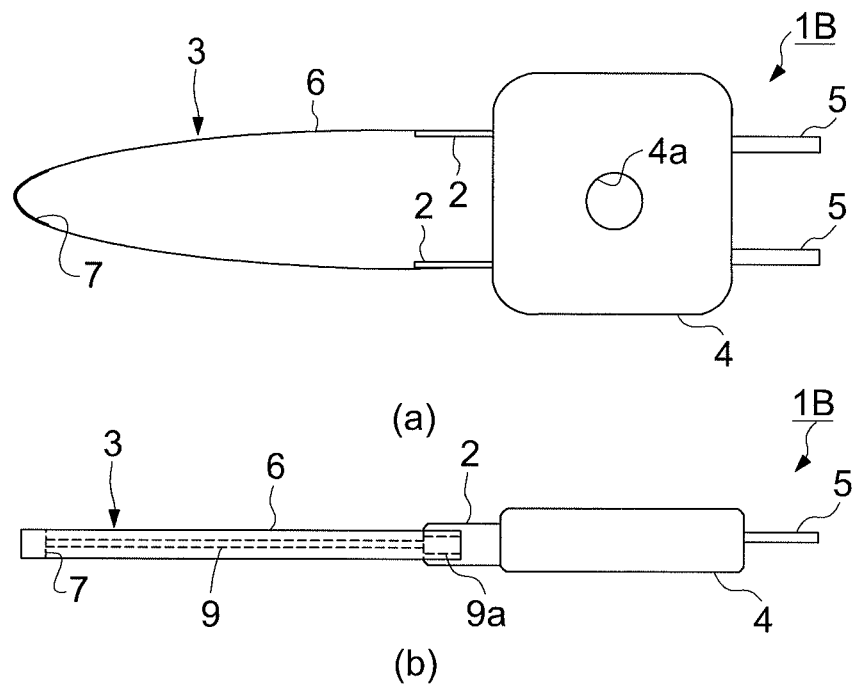
FIG. 7 is a plan view and a front view illustrating another example of the temperature sensor according to the first embodiment of the present invention.

As another example of the first embodiment, both ends of the insulating film (6) may be bonded to the outside of the pair of lead frames (2) with the sensor portion (3) folded while the thin film thermistor portion (7) is disposed on the inside thereof as shown in the temperature sensor (1B) in FIG. 7.

Next, a description will be given below of a temperature sensor according to a second embodiment of the present invention with reference to FIGS. 8 and 9. In the following embodiments, the same components as those described in the above embodiment are denoted by the same reference numerals, and description thereof is omitted.

Figure 8:
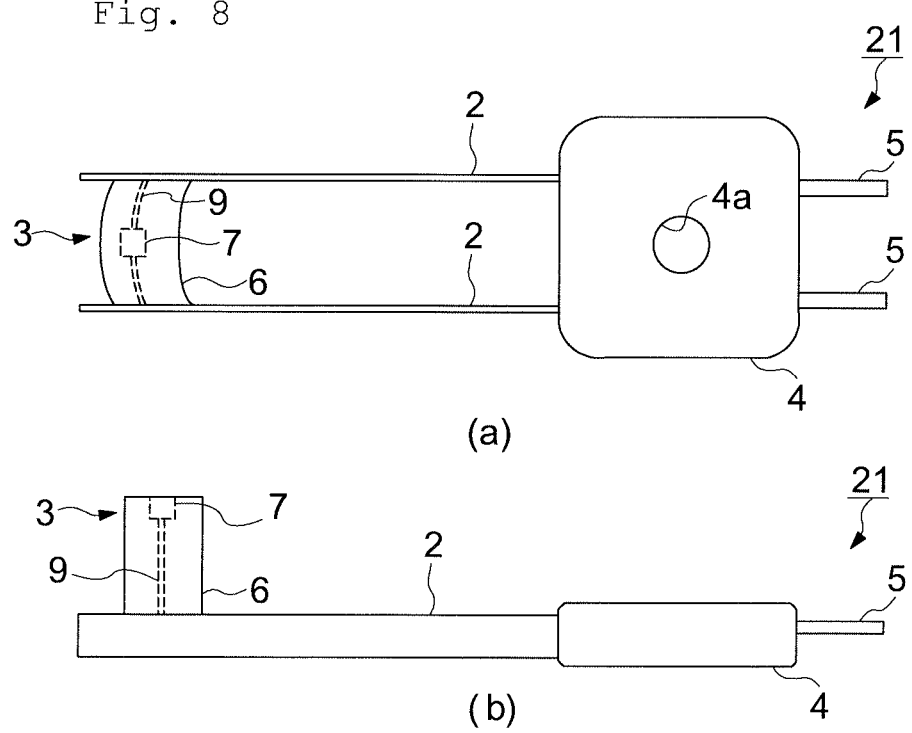
FIG. 8 is a plan view and a front view illustrating a temperature sensor according to a second embodiment of the present invention.

The second embodiment is different from the first embodiment in that, although, in the first embodiment, the insulating film (6) is bent to protrude in the protruding direction of the lead frames (2), in the temperature sensor (21) of the second embodiment, the insulating film (6) is bent to protrude in a direction perpendicular to the protruding direction of the lead frames (2) as shown in FIG. 8.

Specifically, in the second embodiment, the pair of adhesive pad portions (9a) formed at both ends of the insulating film (6) is bonded to the pair of lead frames (2) so that the insulating film (6) and the pattern electrodes (9) extend in a direction perpendicular to the extending direction (protruding direction) of the lead frames (2) with the sensor portion (3) folded. Note that the lead frames (2) of the second embodiment protrude further than the lead frames (2) of the first embodiment.

Thus, since, in the temperature sensor (21) of the second embodiment, the insulating film (6) is bent to protrude in a direction perpendicular to the protruding direction of the lead frames (2), the measurement object is placed forward in a direction perpendicular to the protruding direction of the lead frames (2) and the distal end of the bent sensor portion (3) is brought into abutment against the measurement object, resulting in capable of measuring the temperature thereof. As described above, in the second embodiment, the protruding direction of the insulating film (6) is different from that of the lead frames (2), the temperature sensor (21) can be installed even if a sufficient space cannot be provided in the protruding direction of the lead frames (2).

Figure 9:
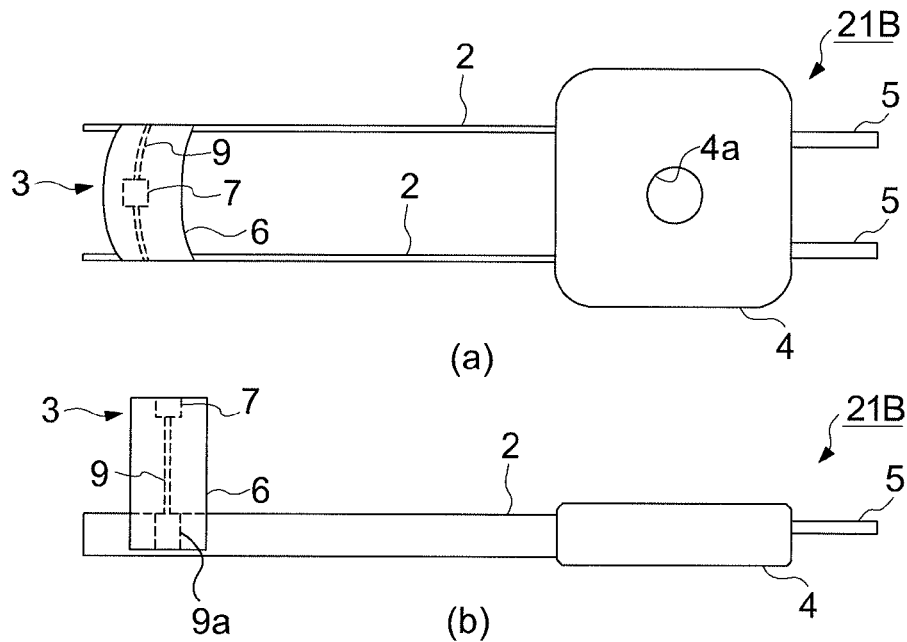
FIG. 9 is a plan view and a front view illustrating another example of the temperature sensor according to the second embodiment of the present invention.

As shown in the temperature sensor (21B) in FIG. 9 as another example of the second embodiment, the sensor portion (3) may be folded with the thin film thermistor portion (7) disposed inside thereof so as to bond both ends of the insulating film (6) to an outside of the pair of lead frames (2).

EXAMPLES

Next, the evaluation results of Examples produced based on the above embodiment with regard to the temperature sensor according to the present invention will be specifically described with reference to FIGS. 10 to 18.

<Production of Film Evaluation Element>

Figure 10:
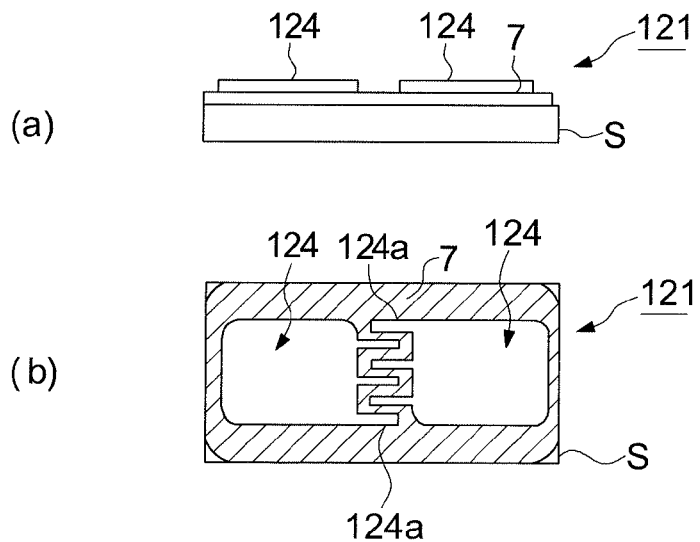
FIG. 10 is a front view and a plan view illustrating a film evaluation element for a metal nitride material for a thermistor according to Example of the temperature sensor of the present invention.

Film evaluation elements (121) shown in FIG. 10 were produced as follows as Examples and Comparative Examples for evaluating the thermistor material layer (the thin film thermistor portion (7)) of the present invention.

Firstly, each of the thin film thermistor portions (7) having a thickness of 500 nm, which were made of metal nitride materials formed with various composition ratios as shown in Table 1, was formed on a Si wafer with a thermal oxidation film as a Si substrate (S) by using Ti—Al alloy targets formed with various composition ratios in the reactive sputtering method. The thin film thermistor portions (7) were produced under the sputtering conditions of an ultimate degree of vacuum of $5 \times 10^{-6}$ Pa, a sputtering gas pressure of from 0.1 to 1 Pa, a target input power (output) of from 100 to 500 W, and a nitrogen gas fraction under a mixed gas (Ar gas+nitrogen gas) atmosphere of from 10 to 100%.

Next, a Cr film having a thickness of 20 nm was formed on the thin film thermistor portion (7) and an Au film having a thickness of 100 nm was further formed thereon by the sputtering method. Furthermore, a resist solution was coated on the laminated metal films using a spin coater, and then prebaking was performed for 1.5 minutes at a temperature of 110° C. After being exposed by an exposure device, an unnecessary portion was removed by a developing solution, and then patterning was performed by post baking for 5 minutes at a temperature of 150° C. Then, an unnecessary electrode portion was subject to wet etching using commercially available Au etchant and Cr etchant, and then the resist was stripped so as to form a pair of the pattern electrodes (124) each having a desired comb electrode portion (124*a*). Then, the resulting elements were diced into chip elements so as to obtain film evaluation elements (121) for evaluating a B constant and for testing heat resistance.

Note that Comparative Examples in which the film evaluation elements (121) respectively have the composition ratios of $Ti_xAl_yN_z$ outside the range of the present invention and have different crystal systems were similarly produced for comparative evaluation.

<Film Evaluation>

(1) Composition Analysis

The elemental analysis for the thin film thermistor portion (7) obtained by the reactive sputtering method was performed by X-ray photoelectron spectroscopy (XPS). In the XPS, a quantitative analysis was performed for a sputtering surface at a depth of 20 nm from the outermost surface by Ar sputtering. The results are shown in Table 1. In the following tables, the composition ratio is represented by "at %".

In the X-ray photoelectron spectroscopy (XPS), a quantitative analysis was performed under the conditions of an X-ray source of MgKα (350 W), a path energy of 58.5 eV, a measurement interval of 0.125 eV, a photo-electron take-off angle with respect to a sample surface of 45 deg, and an analysis area of about 800 ump. For the quantification accuracy, the quantification accuracy of N/(Ti+Al+N) was ±2%, and the quantification accuracy of Al/(Ti+Al) was ±1%.

(2) Specific Resistance Measurement

The specific resistance of each of the thin film thermistor portions (7) obtained by the reactive sputtering method was measured by the four-probe method at a temperature of 25° C. The results are shown in Table 1.

(3) Measurement of B Constant

The resistance value for each of the film evaluation elements (121) at temperatures of 25° C. and 50° C. was measured in a constant temperature bath, and a B constant was calculated based on the resistance values at temperatures of 25° C. and 50° C. The results are shown in Table 1.

In the B constant calculating method of the present invention, the B constant is calculated by the following formula using the resistance values at temperatures of 25° C. and 50° C.

$B$ Constant $(K)=\ln(R25/R50)/(1/T25-1/T50)$

R25 (Ω): resistance value at 25° C.

R50 (Ω): resistance value at 50° C.

T25 (K): 298.15 K which is absolute temperature of 25° C. expressed in Kelvin

T50 (K): 323.15 K which is absolute temperature of 50° C. expressed in Kelvin

As can be seen from these results, a thermistor characteristic having a resistivity of 100 Ωcm or greater and a B constant of 1500 K or greater is achieved in all Examples in which the composition ratio of $Ti_xAl_yN_z$ falls within the region enclosed by the points A, B, C, and D in the Ti—Al—N-based ternary phase diagram as shown in FIG. 2, i.e., the region where "0.70≤y/(x+y)≤0.95, 0.4≤z≤0.5, and x+y+z=1".

Figure 11:
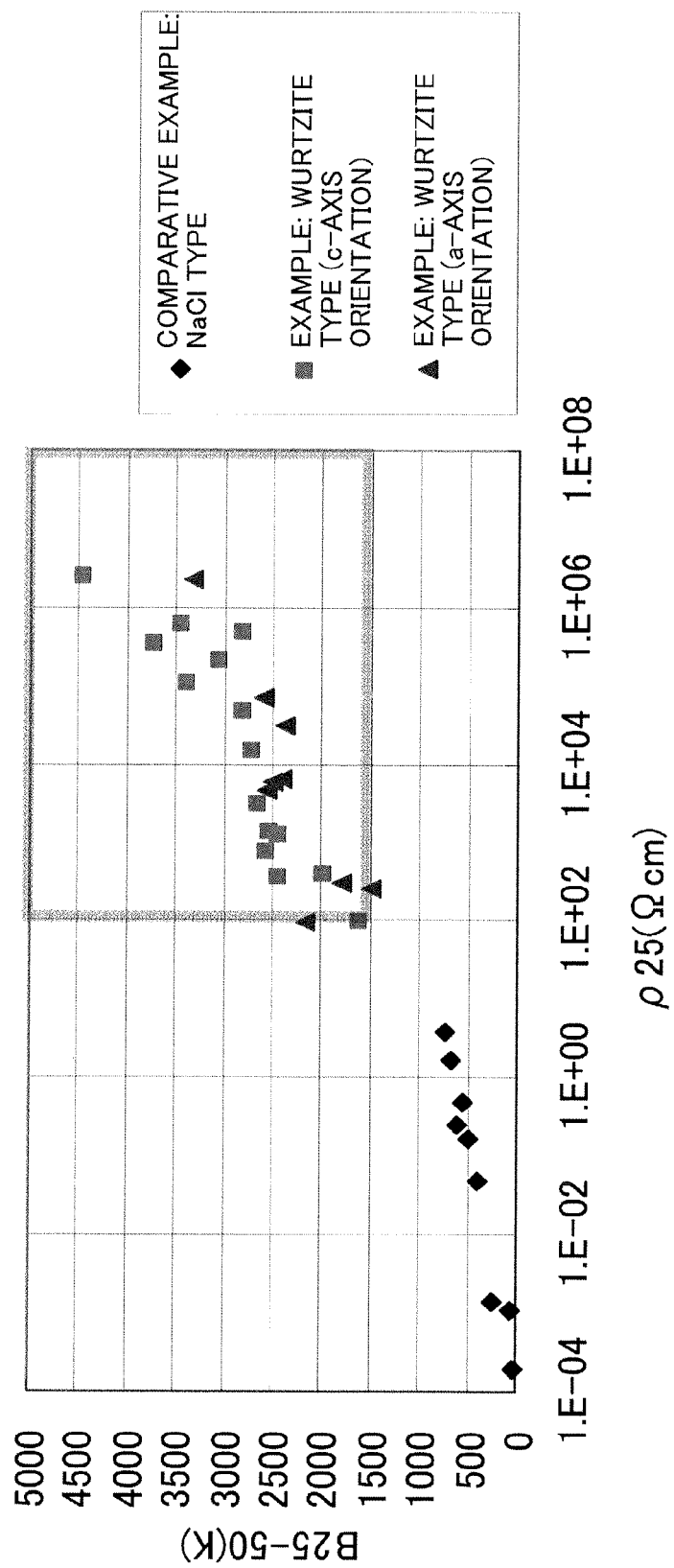
FIG. 11 is a graph illustrating the relationship between a resistivity at 25.degree. C. and a B constant according to Examples and Comparative Example of the present invention.
Figure 12:
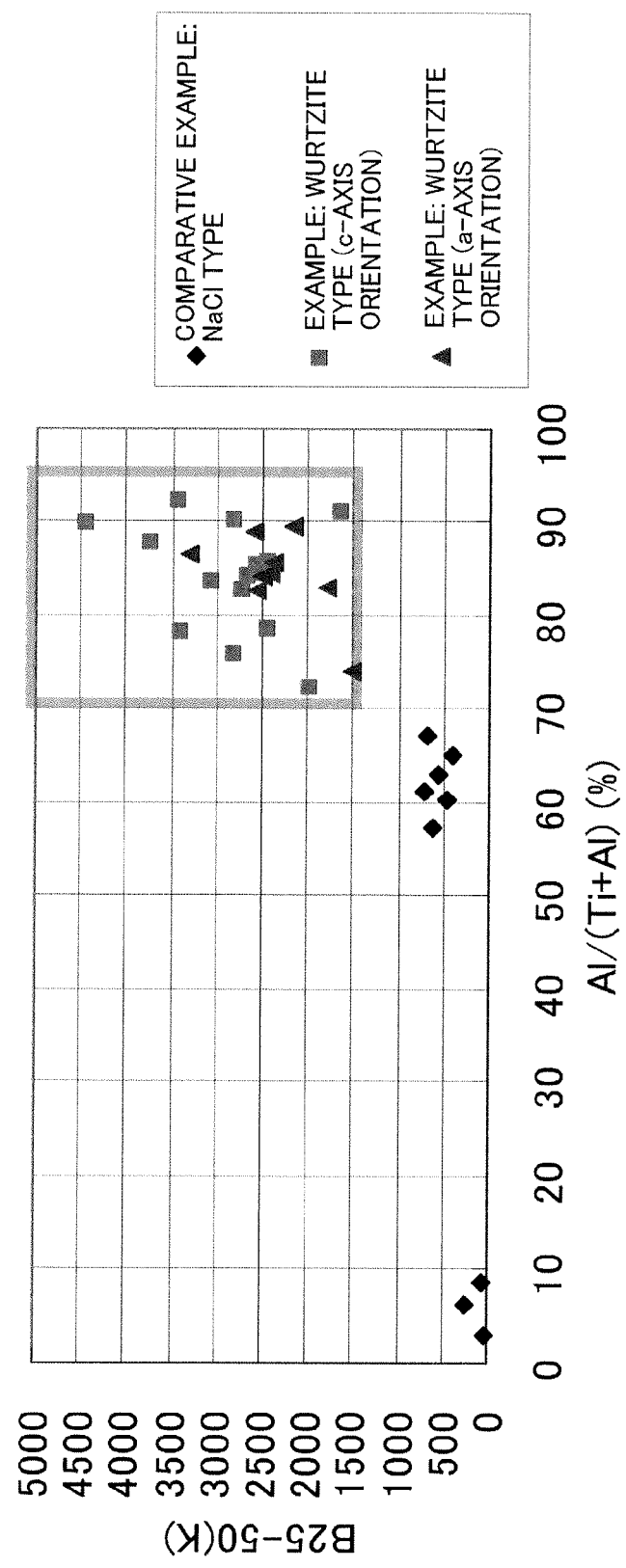
FIG. 12 is a graph illustrating the relationship between the $Al/(Ti+Ai)$ ratio and the B constant according to Examples and Comparative Example of the present invention.

From the above results, a graph illustrating the relationship between a resistivity at 25° C. and a B constant is shown in FIG. 11. Also, a graph illustrating the relationship between the Al/(Ti+Al) ratio and the B constant is shown in FIG. 12. From these graphs, the film evaluation elements (121) which fall within the region where Al/(Ti+Al) is from 0.7 to 0.95 and N/(Ti+Al+N) is from 0.4 to 0.5 and the crystal system thereof is a hexagonal wurtzite-type single phase have a specific resistance value at a temperature of 25° C. of 100 Ωcm or greater and a B constant of 1500 K or greater, and thus, fall within the region of high resistance and high B constant. In data shown in FIG. 12, the reason why the B constant varies with respect to the same Al/(Ti+Al) ratio is because the film evaluation elements (121) have different amounts of nitrogen in their crystals.

Comparative Examples 3 to 12 shown in Table 1 fall within the region where Al/(Ti+Al)<0.7, and the crystal systems are cubic NaCl-type. In Comparative Example 12 (Al/(Ti+Al)=0.67), a NaCl-type phase and a wurtzite-type phase coexist. Thus, the region where Al/(Ti+Al)<0.7 exhibits a specific resistance value at a temperature of 25° C. of less than 100 Ωcm and a B constant of less than 1500 K, and thus, is a region of low resistance and low B constant.

Comparative Examples 1 and 2 shown in Table 1 fall within the region where N/(Ti+Al+N) is less than 40%, and thus, are in a crystal state where nitridation of metals contained therein is insufficient. Comparative Examples 1 and 2 were neither a NaCl-type nor a wurtzite-type and had very poor crystallinity. In addition, it was found that Comparative Examples 1 and 2 exhibited near-metallic behavior because both the B constant and the resistance value were very small.

(4) Thin Film X-Ray Diffraction (Identification of Crystal Phase)

The crystal phases of the thin film thermistor portions (7) obtained by the reactive sputtering method were identified by Grazing Incidence X-ray Diffraction. The thin film X-ray diffraction is a small angle X-ray diffraction experiment. Measurement was performed under the condition of Cu X-ray tube, the angle of incidence of 1 degree, and 2θ of from 20 to 130 degrees.

As a result of measurement, a wurtzite-type phase (hexagonal crystal, the same phase as that of AlN) was obtained in the region where Al/(Ti+Al)≥0.7, whereas a NaCl-type phase (cubic crystal, the same phase as that of TiN) was obtained in the region where Al/(Ti+Al)<0.65. A crystal phase in which a wurtzite-type phase and a NaCl-type phase coexist was obtained in the region where 0.65<Al/(Ti+Al) <0.7.

Thus, in the Ti—Al—N-based metal nitride material, the region of high resistance and high B constant exists in the wurtzite-type phase where Al/(Ti+Al)≥0.7. In Examples of the present invention, no impurity phase was confirmed and the crystal structure thereof was a wurtzite-type single phase.

In Comparative Examples 1 and 2 shown in Table 1, the crystal phase thereof was neither a wurtzite-type phase nor a NaCl-type phase as described above, and thus, could not be identified in the testing. In these Comparative Examples, the peak width of XRD was very large, resulting in obtaining materials exhibiting very poor crystallinity. It is contemplated that the crystal phase thereof was a metal phase with insufficient nitridation because Comparative Examples 1 and 2 exhibited near-metallic behavior from the viewpoint of electric properties.

TABLE 1

| | CRYSTAL SYSTEM | XRD PEAK INTENSITY RATIO OF (100)/(200) WHEN CRYSTAL PHASE IS WURTZITE TYPE PHASE | CRYSTAL AXIS EXHIBITING STRONG DEGREE OF ORIENTATION IN VERTICAL DIRECTION TO SUBSTRATE SURFACE WHEN CRYSTAL PHASE IS WURTZITE TYPE PHASE (a-AXIS OR c-AXIS) | SPUTTERING GAS PRESSURE (Pa) | COMPOSITION RATIO | | | | RESULT OF ELECTRIC PROPERTIES | |
|---|---|---|---|---|---|---|---|---|---|---|
| | | | | | Ti (%) | Al (%) | N (%) | Al/(Ti + Al) (%) | B CONSTANT (K) | SPECIFIC RESISTANCE VALUE AT 25° C. (Ω cm) |
| COMPARATIVE EXAMPLE 1 | UNKNOWN (INSUFFICIENT NITRIDATION) | — | | — | 29 | 43 | 28 | 60 | <0 | 2.E−04 |
| COMPARATIVE EXAMPLE 2 | UNKNOWN (INSUFFICIENT NITRIDATION) | — | | — | 16 | 54 | 30 | 77 | 25 | 4.E−04 |
| COMPARATIVE EXAMPLE 3 | NaCl TYPE | — | | — | 50 | 0 | 50 | 0 | <0 | 2.E−05 |
| COMPARATIVE EXAMPLE 4 | NaCl TYPE | — | | — | 47 | 1 | 52 | 3 | 30 | 2.E−04 |
| COMPARATIVE EXAMPLE 5 | NaCl TYPE | — | | — | 51 | 3 | 46 | 6 | 248 | 1.E−03 |
| COMPARATIVE EXAMPLE 6 | NaCl TYPE | — | | — | 50 | 5 | 45 | 9 | 69 | 1.E−03 |
| COMPARATIVE EXAMPLE 7 | NaCl TYPE | — | | — | 23 | 30 | 47 | 57 | 622 | 3.E−01 |
| COMPARATIVE EXAMPLE 8 | NaCl TYPE | — | | — | 22 | 33 | 45 | 60 | 477 | 2.E−01 |
| COMPARATIVE EXAMPLE 9 | NaCl TYPE | — | | — | 21 | 32 | 47 | 61 | 724 | 4.E+00 |
| COMPARATIVE EXAMPLE 10 | NaCl TYPE | — | | — | 20 | 34 | 46 | 63 | 564 | 5.E−01 |
| COMPARATIVE EXAMPLE 11 | NaCl TYPE | — | | — | 19 | 35 | 46 | 65 | 402 | 5.E−02 |
| COMPARATIVE EXAMPLE 12 | NaCl TYPE + WURTZITE TYPE | — | | — | 18 | 37 | 45 | 67 | 685 | 2.E+00 |
| EXAMPLE 1 | WURTZITE TYPE | 0.05 | c-AXIS | <0.67 | 15 | 38 | 47 | 72 | 1980 | 4.E+02 |
| EXAMPLE 2 | WURTZITE TYPE | 0.07 | c-AXIS | <0.67 | 12 | 38 | 50 | 76 | 2798 | 5.E+04 |
| EXAMPLE 3 | WURTZITE TYPE | 0.45 | c-AXIS | <0.67 | 11 | 42 | 47 | 79 | 3385 | 1.E+05 |
| EXAMPLE 4 | WURTZITE TYPE | <0.01 | c-AXIS | <0.67 | 11 | 41 | 48 | 79 | 2437 | 4.E+02 |
| EXAMPLE 5 | WURTZITE TYPE | 0.34 | c-AXIS | <0.67 | 9 | 43 | 48 | 83 | 2727 | 2.E+04 |
| EXAMPLE 6 | WURTZITE TYPE | <0.01 | c-AXIS | <0.67 | 8 | 42 | 50 | 84 | 3057 | 2.E+03 |
| EXAMPLE 7 | WURTZITE TYPE | 0.09 | c-AXIS | <0.67 | 8 | 44 | 48 | 84 | 2665 | 3.E+03 |
| EXAMPLE 8 | WURTZITE TYPE | 0.05 | c-AXIS | <0.67 | 8 | 44 | 48 | 85 | 2527 | 1.E+03 |
| EXAMPLE 9 | WURTZITE TYPE | <0.01 | c-AXIS | <0.67 | 8 | 45 | 47 | 86 | 2557 | 8.E+02 |
| EXAMPLE 10 | WURTZITE TYPE | 0.04 | c-AXIS | <0.67 | 7 | 46 | 46 | 86 | 2449 | 1.E+03 |
| EXAMPLE 11 | WURTZITE TYPE | 0.24 | c-AXIS | <0.67 | 7 | 48 | 45 | 88 | 3729 | 4.E+05 |
| EXAMPLE 12 | WURTZITE TYPE | 0.73 | c-AXIS | <0.67 | 5 | 49 | 46 | 90 | 2798 | 5.E+05 |
| EXAMPLE 13 | WURTZITE TYPE | <0.01 | c-AXIS | <0.67 | 5 | 45 | 50 | 90 | 4449 | 3.E+06 |
| EXAMPLE 14 | WURTZITE TYPE | 0.38 | c-AXIS | <0.67 | 5 | 50 | 45 | 91 | 1621 | 1.E+02 |
| EXAMPLE 15 | WURTZITE TYPE | 0.13 | c-AXIS | <0.67 | 4 | 50 | 46 | 93 | 3439 | 6.E+05 |
| EXAMPLE 16 | WURTZITE TYPE | 3.54 | a-AXIS | ≥0.67 | 15 | 43 | 42 | 74 | 1507 | 3.E+02 |
| EXAMPLE 17 | WURTZITE TYPE | 2.94 | a-AXIS | ≥0.67 | 10 | 49 | 41 | 83 | 1794 | 3.E+02 |
| EXAMPLE 18 | WURTZITE TYPE | 1.05 | a-AXIS | ≥0.67 | 6 | 52 | 42 | 90 | 2164 | 1.E+02 |
| EXAMPLE 19 | WURTZITE TYPE | 2.50 | a-AXIS | ≥0.67 | 9 | 44 | 47 | 83 | 2571 | 5.E+03 |
| EXAMPLE 20 | WURTZITE TYPE | 9.09 | a-AXIS | ≥0.67 | 8 | 46 | 46 | 84 | 2501 | 6.E+03 |
| EXAMPLE 21 | WURTZITE TYPE | 6.67 | a-AXIS | ≥0.67 | 8 | 45 | 47 | 84 | 2408 | 7.E+03 |
| EXAMPLE 22 | WURTZITE TYPE | 2.22 | a-AXIS | ≥0.67 | 8 | 46 | 46 | 86 | 2364 | 3.E+04 |
| EXAMPLE 23 | WURTZITE TYPE | 1.21 | a-AXIS | ≥0.67 | 7 | 46 | 47 | 87 | 3317 | 2.E+06 |
| EXAMPLE 24 | WURTZITE TYPE | 3.33 | a-AXIS | ≥0.67 | 6 | 51 | 43 | 89 | 2599 | 7.E+04 |

Next, all of Examples in the present invention were wurtzite-type phase films having strong orientation. Thus, whether the films have strong a-axis orientation or c-axis orientation to the crystal axis in a vertical direction (film thickness direction) to the Si substrate (S) was examined by XRD. At this time, in order to examine the orientation of crystal axis, the peak intensity ratio of (100)/(002) was measured, where (100) is the Miller index indicating a-axis orientation and (002) is the Miller index indicating c-axis orientation.

Consequently, in Examples in which film deposition was performed at a sputtering gas pressure of less than 0.67 Pa, the intensity of (002) was much stronger than that of (100), so that the films exhibited stronger c-axis orientation than a-axis orientation. On the other hand, in Examples in which film deposition was performed at a sputtering gas pressure of 0.67 Pa or greater, the intensity of (100) was much stronger than that of (002), so that the films exhibited stronger a-axis orientation than c-axis orientation.

Note that it was confirmed that a wurtzite-type single phase was formed in the same manner even when the thin film thermistor portion (7) was deposited on a polyimide film under the same deposition condition. In addition, it was confirmed that the crystal orientation did not change even when the thin film thermistor portion (7) was deposited on a polyimide film under the same deposition condition.

Figure 13:
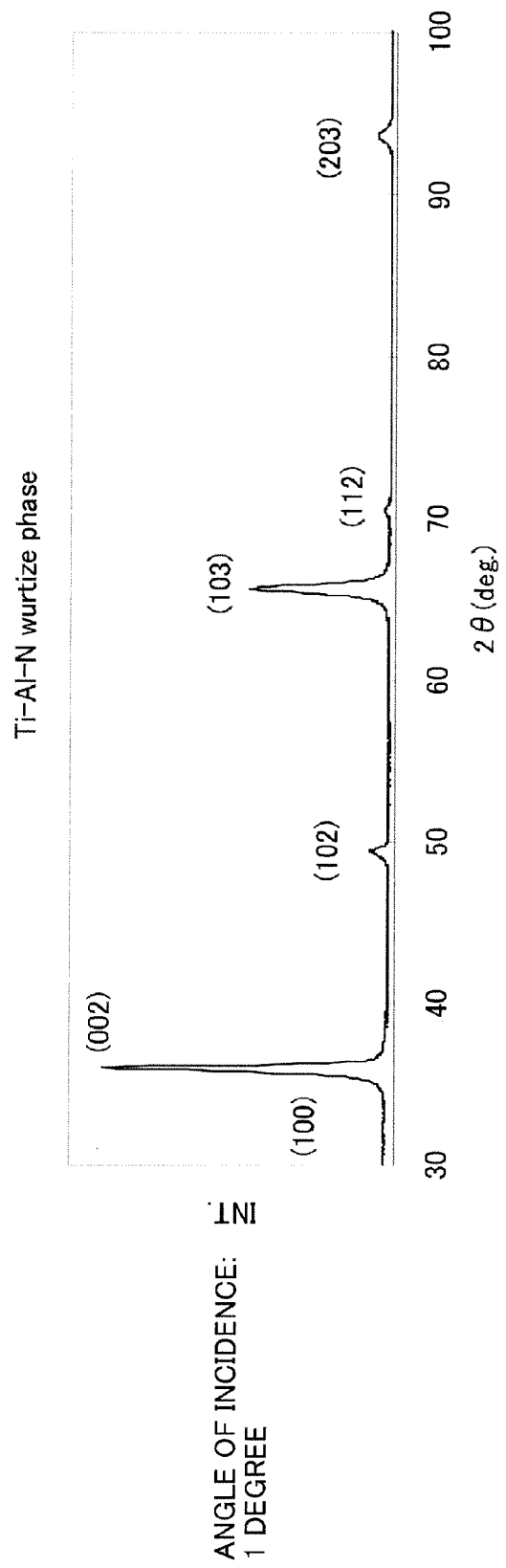
FIG. 13 is a graph illustrating the result of X-ray diffraction (XRD) in the case of a strong c-axis orientation where $Al/(Ti+Al)=0.84$ according to Example of the present invention.

An exemplary XRD profile in Example exhibiting strong c-axis orientation is shown in FIG. 13. In this Example, Al/(Ti+Al) was equal to 0.84 (wurtzite-type, hexagonal crystal), and measurement was performed at the angle of incidence of 1 degree. As can be seen from the result in this Example, the intensity of (002) was much stronger than that of (100).

Figure 14:
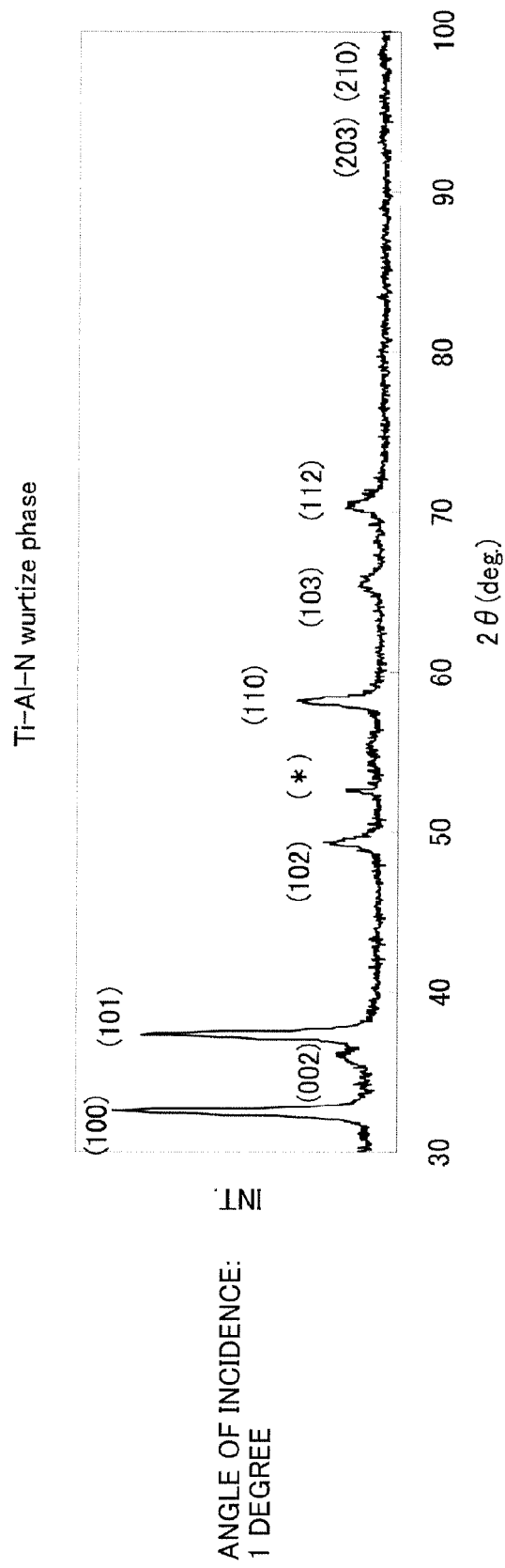
FIG. 14 is a graph illustrating the result of X-ray diffraction (XRD) in the case of a strong a-axis orientation where $Al/(Ti+Al)=0.83$ according to Example of the present invention.

An exemplary XRD profile in Example exhibiting strong a-axis orientation is shown in FIG. 14. In this Example, Al/(Ti+Al) was equal to 0.83 (wurtzite-type, hexagonal crystal), measurement was performed at the angle of incidence of 1 degree. As can be seen from the result in this Example, the intensity of (100) was much stronger than that of (002).

Furthermore, in this Example, symmetrical reflective measurement was performed at the angle of incidence of 0 degrees. The asterisk (*) in the graph was a peak derived from the device, and thus, it was confirmed that the asterisk (*) in the graph is neither a peak derived from the sample itself nor a peak derived from the impurity phase (it can be seen from the fact that the peak indicated by (*) is lost in the symmetrical reflective measurement, and thus, it is a peak derived from the device).

Figure 15:
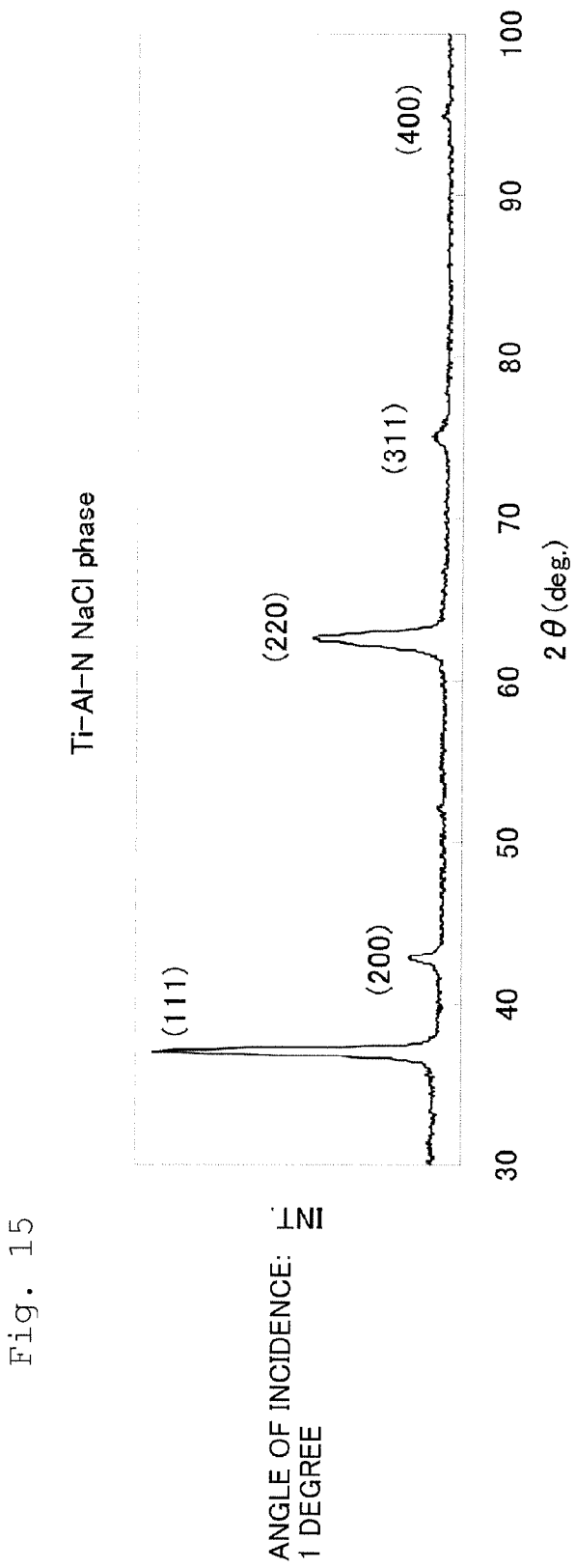
FIG. 15 is a graph illustrating the result of X-ray diffraction (XRD) in the case where $Al/(Ti+Al)=0.60$ according to Comparative Example of the present invention.

An exemplary XRD profile in Comparative Example is shown in FIG. 15. In this Comparative Example, Al/(Ti+Al) was equal to 0.6 (NaCl type, cubic crystal), and measurement was performed at the angle of incidence of 1 degree. No peak which could be indexed as a wurtzite-type (space group P6$_3$mc (No. 186)) was detected, and thus, this Comparative Example was confirmed as a NaCl-type single phase.

Next, the correlation between a crystal structure and its electric properties was compared in detail with each other with regard to Examples of the present invention in which the wurtzite-type materials were employed.

Figure 16:
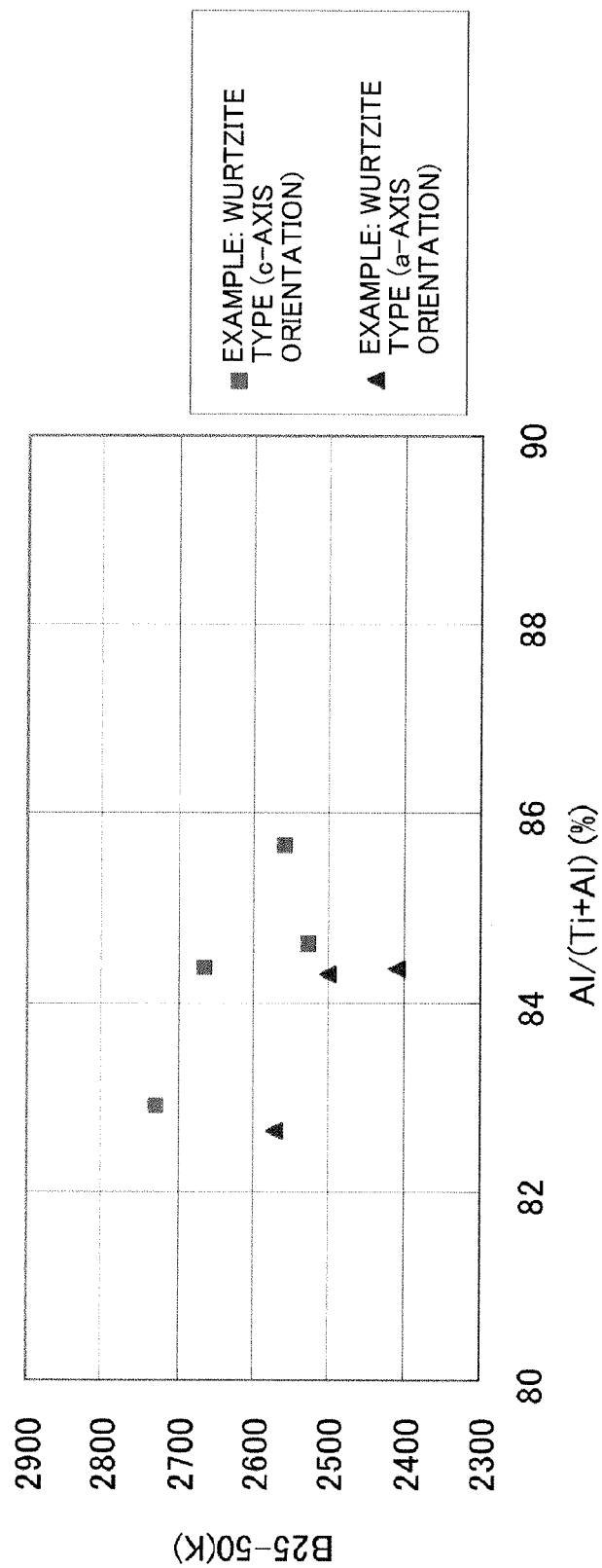
FIG. 16 is a graph illustrating the relationship between the $Al/(Ti+Al)$ ratio and the B constant obtained by comparing Example revealing a strong a-axis orientation and Example revealing a strong c-axis orientation according to Examples of the present invention.

As shown in Table 2 and FIG. 16, there were materials (Examples 5, 7, 8, and 9) of which the crystal axis is strongly oriented along a c-axis in a vertical direction to the surface of the substrate and materials (Examples 19, 20, and 21) of which the crystal axis is strongly oriented along an a-axis in a vertical direction to the surface of the substrate despite the fact that they have substantially the same Al/(Ti+Al) ratio.

When both groups were compared to each other, it was found that the materials having a strong c-axis orientation had a greater B constant by about 100 K than that of the materials having a strong a-axis orientation upon the same Al/(Ti+Al) ratio. When focus was placed on the amount of N (N/(Ti+Al+N)), it was found that the materials having a strong c-axis orientation had a slightly larger amount of nitrogen than that of the materials having a strong a-axis orientation. Since the ideal stoichiometric ratio of N/(Ti+Al+N) is 0.5, it was found that the materials having a strong c-axis orientation were ideal materials due to a small amount of nitrogen defects.

TABLE 2

| | CRYSTAL SYSTEM | WURTZITE TYPE PHASE | XRD PEAK INTENSITY RATIO OF (100)/(200) WHEN CRYSTAL PHASE IS WURTZITE TYPE PHASE | CRYSTAL AXIS EXHIBITING STRONG DEGREE OF ORIENTATION IN VERTICAL DIRECTION TO SUBSTRATE SURFACE WHEN CRYSTAL PHASE IS WURTZITE (a-AXIS OR c-AXIS) | SPUTTERING GAS PRESSURE (Pa) | COMPOSITION RATIO | | | | RESULT OF ELECTRIC PROPERTIES | |
|---|---|---|---|---|---|---|---|---|---|---|---|
| | | | | | | Ti (%) | Al (%) | N (%) | Al/(Ti + Al) (%) | B CONSTANT (K) | SPECIFIC RESISTANCE VALUE AT 25° C. (Ω cm) |
| EXAMPLE 5 | WURTZITE TYPE | WURTZITE TYPE | 0.34 | c-AXIS | <0.67 | 9 | 43 | 48 | 83 | 2727 | 2.E+04 |
| EXAMPLE 7 | WURTZITE TYPE | WURTZITE TYPE | 0.09 | c-AXIS | <0.67 | 8 | 44 | 48 | 84 | 2665 | 3.E+03 |
| EXAMPLE 8 | WURTZITE TYPE | WURTZITE TYPE | 0.05 | c-AXIS | <0.67 | 8 | 44 | 48 | 85 | 2527 | 1.E+03 |
| EXAMPLE 9 | WURTZITE TYPE | WURTZITE TYPE | <0.01 | c-AXIS | <0.67 | 8 | 45 | 47 | 86 | 2557 | 8.E+02 |
| EXAMPLE 19 | WURTZITE TYPE | WURTZITE TYPE | 2.50 | a-AXIS | ≥0.67 | 9 | 44 | 47 | 83 | 2571 | 5.E+03 |
| EXAMPLE 20 | WURTZITE TYPE | WURTZITE TYPE | 9.09 | a-AXIS | ≥0.67 | 8 | 46 | 46 | 84 | 2501 | 6.E+03 |
| EXAMPLE 21 | WURTZITE TYPE | WURTZITE TYPE | 6.87 | a-AXIS | ≥0.67 | 8 | 45 | 47 | 84 | 2408 | 7.E+03 |

<Crystaline Form Evaluation>

Figure 17:
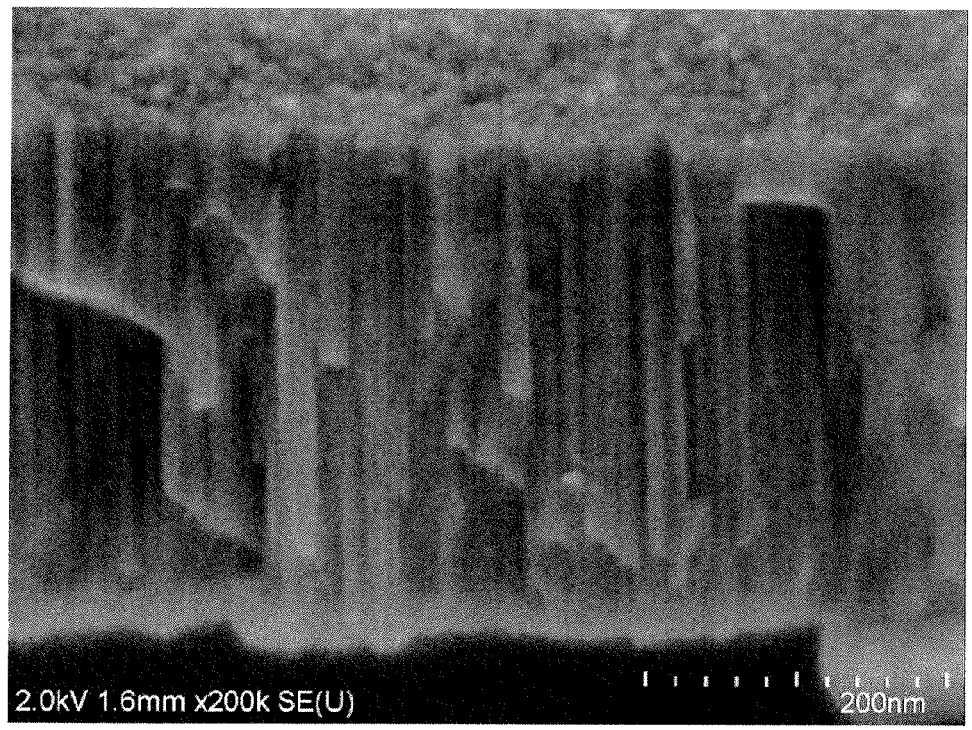
FIG. 17 is a cross-sectional SEM photograph illustrating Example revealing a strong c-axis orientation according to Example of the present invention.
Figure 18:
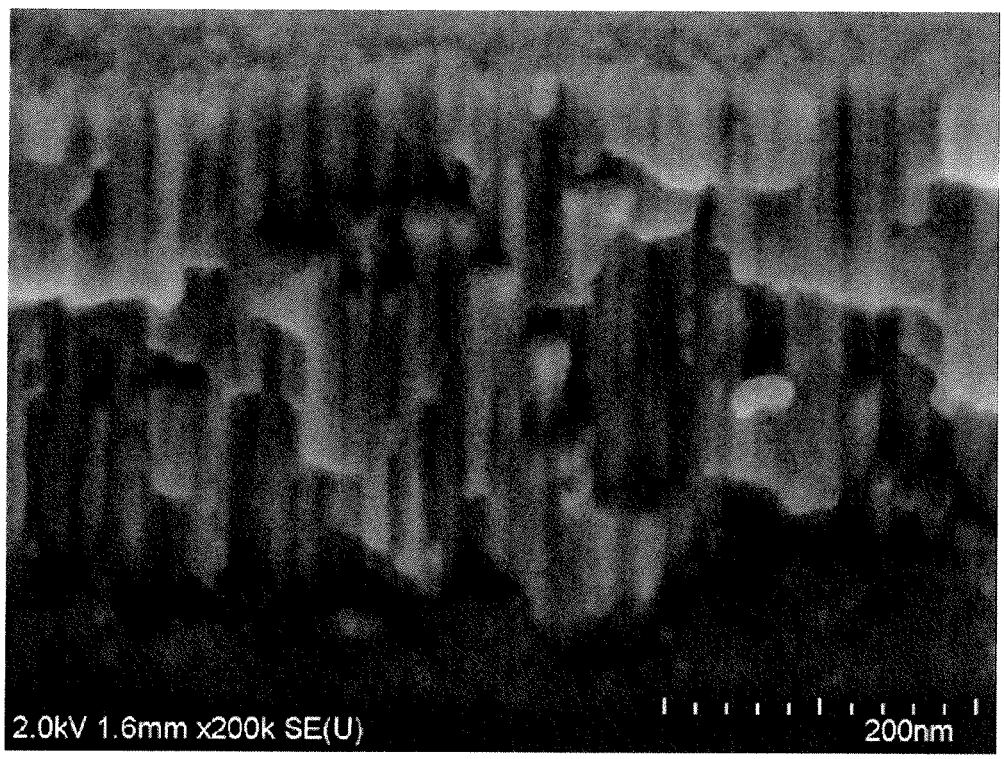
FIG. 18 is a cross-sectional SEM photograph illustrating Example revealing a strong a-axis orientation according to Example of the present invention.

Next, as an exemplary crystalline form in the cross-section of the thin film thermistor portion (7), a cross-sectional SEM photograph of the thin film thermistor portion (7) in Example (Al/(Ti+Al)=0.84, wurtzite-type, hexagonal crystal, and strong c-axis orientation) in which the thin film thermistor portion (7) was deposited on the Si substrate (S) with a thermal oxidation film is shown in FIG. 17. Also, a cross-sectional SEM photograph of the thin film thermistor portion (7) in another Example (Al/(Ti+Al)=0.83, wurtzite-type, hexagonal crystal, and strong a-axis orientation) is shown in FIG. 18.

The samples in these Examples were obtained by breaking the Si substrates (S) by cleaving them. The photographs were taken by tilt observation at the angle of 45 degrees.

As can be seen from these photographs, samples were formed of a high-density columnar crystal in both Examples. Specifically, the growth of columnar crystal in a direction perpendicular to the surface of the substrate was observed in Example revealing a strong c-axis orientation and another Example revealing a strong a-axis orientation. Note that the break of the columnar crystal was generated upon breaking the Si substrate (S) by cleaving it.

<Film Heat Resistance Test Evaluation>

In Examples and Comparative Example shown in Table 1, a resistance value and a B constant before and after the heat resistance test at a temperature of 125° C. for 1000 hours in air were evaluated. The results are shown in Table 3. Comparative Example made by a conventional Ta—Al—N-based material was also evaluated in the same manner for comparison.

As can be seen from these results, although the Al concentration and the nitrogen concentration vary, the heat resistance of the Ti—Al—N-based material based on the electric properties change before and after the heat resistance test is better than the Ta—Al—N-based material in Comparative Example when comparison is made by using the same B constant. Note that the materials used in Examples 5 and 8 have a strong c-axis orientation and the materials used in Examples 21 and 24 have a strong a-axis orientation. When both groups were compared to each other, the heat resistance of Examples revealing a strong c-axis orientation is slightly improved as compared with that of Examples revealing a strong a-axis orientation.

Note that, in the Ta—Al—N-based material, ionic radius of Ta is very large compared to that of Ti and Al, and thus, a wurtzite-type phase cannot be produced in the high-concentration Al region. It is contemplated that the Ti—Al—N-based material having the wurtzite-type phase has better heat resistance than the Ta—Al—N-based material because the Ta—Al—N-based material is not the wurtzite-type phase.

The technical scope of the present invention is not limited to the aforementioned embodiments and Examples, but the present invention may be modified in various ways without departing from the scope or teaching of the present invention.

REFERENCE NUMERALS

1, 1B, 21, and 21B: temperature sensor, 2: lead frame, 3: sensor portion, 4: holding portion, 6: insulating film, 7: thin film thermistor portion, 8: comb electrode, 8*a*: comb portion, 9: pattern electrode, 10: protective film

What is claimed is:

1. A temperature sensor comprising:

a pair of lead frames;

a sensor portion connected to the pair of lead frames; and an insulating holding portion which is fixed to the pair of lead frames and holds the lead frames, wherein the sensor portion comprises:

an insulating film having a strip shape;

a thin film thermistor portion pattern-formed with a thermistor material at the center portion of the surface of the insulating film;

a pair of comb electrodes which have a plurality of comb portions and are pattern-formed on at least one of the top or the bottom of the thin film thermistor portion with facing each other; and a pair of pattern electrodes, of which one end is connected to the pair of comb electrodes and the other end is connected to the pair of lead frames at both ends of the insulating film, pattern-formed on the surface of the insulating film, and wherein the thin film thermistor portion is disposed on the distal end of the insulating film in a state of being bent into a substantially U-shape, and both ends of the insulating film are fixed to the pair of lead frames.

2. The temperature sensor according to claim 1, wherein the insulating film is bent to protrude in the protruding direction of the lead frames.

3. The temperature sensor according to claim 1, wherein the insulating film is bent to protrude in a direction perpendicular to the protruding direction of the lead frames.

TABLE 3

| | M ELEMENT | M (%) | Al (%) | N (%) | Al/ (M + Al) (%) | B25-50 (K) | SPECIFIC RESISTANCE VALUE AT 25° C. (Ω cm) | RISING RATE OF SPECIFIC RESISTANCE AT 25° C. AFTER HEAT RESISTANCE TEST AT 125° C. FOR 1,000 HOURS (%) | RISING RATE OF B CONSTANT AFTER HEAT RESISTANCE TEST AT 125° C. for 1,000 HOURS (%) |
|---|---|---|---|---|---|---|---|---|---|
| COMPARATIVE EXAMPLE | Ta | 60 | 1 | 39 | 2 | 2671 | 5.E+02 | 25 | 16 |
| EXAMPLE 5 | Ti | 9 | 43 | 48 | 83 | 2727 | 2.E+04 | <4 | <1 |
| EXAMPLE 8 | Ti | 8 | 44 | 48 | 85 | 2527 | 1.E+03 | <4 | <1 |
| EXAMPLE 21 | Ti | 8 | 45 | 47 | 84 | 2408 | 7.E+03 | <5 | <1 |
| EXAMPLE 24 | Ti | 6 | 51 | 43 | 89 | 2599 | 7.E+04 | <5 | <1 |

4. The temperature sensor according to claim 1, wherein the thin film thermistor portion consists of a metal nitride represented by the general formula: $Ti_xAl_yN_z$ (where $0.70 \leq y/(x+y) \leq 0.95$, $0.4 \leq z \leq 0.5$, and $x+y+z=1$), and the crystal structure thereof is a hexagonal wurtzite-type single phase.

* * * * *